(12) United States Patent
Ohgishi

(10) Patent No.: US 9,105,547 B2
(45) Date of Patent: *Aug. 11, 2015

(54) SOLID STATE IMAGING DEVICE, METHOD OF MANUFACTURING THE SAME, AND IMAGING APPARATUS

(71) Applicant: Sony Corporation, Tokyo (JP)

(72) Inventor: Yuko Ohgishi, Tokyo (JP)

(73) Assignee: SONY CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/289,213

(22) Filed: May 28, 2014

(65) Prior Publication Data

US 2014/0264706 A1  Sep. 18, 2014

Related U.S. Application Data

(60) Division of application No. 13/655,896, filed on Oct. 19, 2012, now Pat. No. 8,765,515, which is a continuation of application No. 13/047,275, filed on Mar. 14, 2011, now Pat. No. 8,343,793, which is a continuation of application No. 12/237,671, filed on Sep. 25, 2008, now Pat. No. 7,939,359.

(30) Foreign Application Priority Data

Oct. 3, 2007  (JP) .................. 2007-259501

(51) Int. Cl.
*H01L 21/00* (2006.01)
*H01L 31/08* (2006.01)
*H01L 27/146* (2006.01)
*H04N 5/369* (2011.01)

(52) U.S. Cl.
CPC ........ *H01L 27/1464* (2013.01); *H01L 27/1462* (2013.01); *H01L 27/14643* (2013.01); *H01L 27/14687* (2013.01); *H04N 5/369* (2013.01); *H01L 27/14623* (2013.01); *H01L 27/14625* (2013.01)

(58) Field of Classification Search
CPC .................................................. H01L 27/1464
USPC ......... 257/439, 447, 450–452, 47; 438/57, 69
See application file for complete search history.

(56) References Cited

U.S. PATENT DOCUMENTS

| | | | |
|---|---|---|---|
| 7,939,359 B2 * | 5/2011 | Ohgishi | 438/57 |
| 8,343,793 B2 * | 1/2013 | Ohgishi | 438/57 |
| 8,765,515 B2 * | 7/2014 | Ohgishi | 438/57 |

* cited by examiner

*Primary Examiner* — Calvin Lee
(74) *Attorney, Agent, or Firm* — Sheridan Ross P.C.

(57) ABSTRACT

A solid state imaging device including: a plurality of sensor sections formed in a semiconductor substrate in order to convert incident light into an electric signal; a peripheral circuit section formed in the semiconductor substrate so as to be positioned beside the sensor sections; and a layer having negative fixed electric charges that is formed on a light incidence side of the sensor sections in order to form a hole accumulation layer on light receiving surfaces of the sensor sections.

13 Claims, 10 Drawing Sheets

SOLID STATE IMAGING DEVICE, METHOD OF MANUFACTURING THE SAME, AND IMAGING APPARATUS

CROSS-REFERENCE TO RELATED APPLICATIONS

This application is a division of U.S. patent application Ser. No. 13/655,896, filed Oct. 19, 2012, now U.S. Pat. No. 8,765,515 issued Jul. 1, 2014, which is a continuation of U.S. patent application Ser. No. 13/047,275, filed Mar. 14, 2011, now U.S. Pat. No. 8,343,793 issued Jan. 1, 2013, which is a continuation of U.S. patent application Ser. No. 12/237,671, filed Sep. 25, 2008, now U.S. Pat. No. 7,939,359 issued May 10, 2011, which claims priority to Japanese Patent Application Serial No. JP 2007-259501, filed in the Japanese Patent Office on Oct. 3, 2007, the entire disclosures of which are hereby incorporated herein by reference.

BACKGROUND OF THE INVENTION

The present invention relates to a solid state imaging device having a hole accumulated diode, a method of manufacturing the same, and an imaging apparatus.

Solid state imaging devices, such as a CCD (charge coupled device) and a CMOS image sensor, are widely used in a video camera, a digital still camera, and the like. Improvement in sensitivity and noise reduction are important issues in all kinds of solid state imaging devices.

In particular, a dark current, which is detected as a very small current when an electric charge (electron) generated from a minute defect in a substrate interface of a light receiving surface is input as a signal, or a dark current generated due to the interface state on the interface between a sensor section and an upper layer even though there is no pure signal charge generated by photoelectric conversion of incident light in a state where there is no incident light is a noise to be reduced in the solid state imaging device.

As a technique of suppressing generation of a dark current caused by the interface state, for example, an embed type photodiode structure having a hole accumulation layer 23 formed of a P$^+$ layer on a sensor section (for example, a photodiode) 12 is used as shown in FIG. 9B. Moreover, in this specification, the embed type photodiode structure is referred to as an HAD (hole accumulated diode) structure. As shown in FIG. 9A, in a structure where the HAD structure is not provided, electrons generated due to the interface state flow to the photodiode as a dark current. On the other hand, as shown in FIG. 9B, in the HAD structure, generation of electrons from the interface is suppressed by the hole accumulation layer 23 formed on the interface. In addition, even if electric charges (electrons) are generated from the interface, the electric charges (electrons) do not flow to a charge accumulation section, which is a potential well in an N$^+$ layer of the sensor section 12, but flow to the hole accumulation layer 23 of the P$^+$ layer in which many holes exist. Accordingly, the electric charges (electrons) can be eliminated. As a result, since it can be prevented that the electric charges generated due to the interface are detected as a dark current, the dark current caused by the interface state can be suppressed.

A method of suppressing the dark current may be adopted in both a CCD and a CMOS image sensor and may also be adopted to not only a known top-emission-type image sensor but also a back illuminated image sensor (for example, refer to JP-A-2003-338615).

As a method of forming the HAD structure, it is common to perform ion implantation of impurities for forming the P$^+$ layer, for example, boron (B) or boron difluoride (BF$_2$) through a thermally oxidized silicon layer or a CVD oxide silicon layer formed on a substrate, to activate injected impurities by annealing, and then to form a p-type region near the interface. However, heat treatment in a high temperature of 700° C. or more is essential in order to activate doped impurities. Accordingly, formation of the hole accumulation layer using ion implantation is difficult in a low-temperature process at 400° C. or less. Also in the case of desiring to avoid long-time activation at high temperature in order to suppress diffusion of dopant, the method of forming a hole accumulation layer in which ion implantation and annealing are performed is not preferable.

Furthermore, when a silicon oxide or a silicon nitride formed on an upper layer of the sensor section is formed in a low-temperature plasma CVD method, for example, the interface state is reduced compared with an interface between a light receiving surface and a layer formed at high temperature. The reduction in interface state increases a dark current.

As described above, in the case of desiring to avoid ion implantation and annealing process at high temperature, not only the hole accumulation layer cannot be formed by known ion implantation but also a dark current is further increased. In order to solve the problem, it becomes necessary to form a hole accumulation layer in another method that is not based on ion implantation in the related art.

As an example, there is a method of forming a layer having negative fixed electric charges on an upper layer of a sensor section. In this method, a hole accumulation layer is formed on the interface at a side of the light receiving surface of the sensor section by the electric field caused by the layer having negative fixed electric charges. Accordingly, electric charges (electrons) generated from the interface is suppressed. In addition, even if electric charges (electrons) are generated from the interface, the electric charges (electrons) do not flow to a charge accumulation portion which is a potential well in the sensor section but flow to the hole accumulation layer in which many holes exist. As a result, the electric charges (electrons) can be eliminated. Thus, since it can be prevented that a dark current generated by the electric charges on the interface is detected in the sensor section, a dark current caused by the interface state is suppressed. Thus, by using the layer having negative fixed electric charges, the HAD structure can be formed without ion implantation and annealing. The layer having negative fixed electric charges may be formed of a hafnium oxide (HfO$_2$) layer, for example.

However, as described above, when the configuration in which the layer having negative fixed electric charges is formed on the light receiving surface is applied to a back illuminated CCD or CMOS image sensor, for example, a layer 22 having negative fixed electric charges is formed on the entire light receiving surface 12s of a sensor section 12 as shown in FIG. 10. Accordingly, a hole accumulation layer 23 (P$^+$ layer) is formed not only in a pixel region where the HAD needs to be formed but also on a surface of a semiconductor substrate 11 on a peripheral circuit section 14.

For example, when a well region, a diffusion layer, a circuit, and the like (a diffusion layer 15 is shown as an example in the drawing) are present in the peripheral circuit section 14 so that a negative electric potential is generated on a back side of the semiconductor substrate 11, holes having positive electric charges are drawn to the negative electric potential to be diffused. Accordingly, a desired negative electric potential is not obtained due to the positive electric charges drawn but an electric potential biased toward a positive side from a designed value is output. As a result, an applied voltage of the sensor section using the electric potential is adversely affected, causing a problem that a pixel characteristic changes.

SUMMARY OF THE INVENTION

The problem to be solved is that since a desired negative electric potential is not obtained and an electric potential biased toward a positive electric potential side from a designed value is output in a peripheral circuit section, an applied voltage of a sensor section using the electric potential is adversely affected, causing a pixel characteristic to change.

In view of the above, it is desirable to allow a peripheral circuit section to normally operate by eliminating the influence of a layer having negative fixed electric charges in the peripheral circuit section.

According to a first embodiment of the present invention, a solid state imaging device includes: a plurality of sensor sections formed in a semiconductor substrate in order to convert incident light into an electric signal; a peripheral circuit section formed in the semiconductor substrate so as to be positioned beside the sensor sections; and a layer having negative fixed electric charges that is formed on the semiconductor substrate at a light incidence side of the sensor sections in order to form a hole accumulation layer on light receiving surfaces of the sensor sections. An N-type impurity region is formed between the peripheral circuit section and the layer having negative fixed electric charges.

In the solid state imaging device according to the first embodiment of the present invention, since the N-type impurity region is formed between the peripheral circuit section and the layer having negative fixed electric charges, the movement of holes generated on the interface of the semiconductor substrate is prevented by the N-type impurity region. Accordingly, since it is prevented that the holes move into the peripheral circuit section, a change in an electric potential of a well region, a diffusion layer, a circuit, and the like that are formed in the peripheral circuit section so as to generate a negative electric potential is suppressed.

According to a second embodiment of the present invention, a solid state imaging device includes: a plurality of sensor sections formed in a semiconductor substrate in order to convert incident light into an electric signal; a peripheral circuit section formed in the semiconductor substrate so as to be positioned beside the sensor sections; and a layer having negative fixed electric charges that is formed on a light incidence side of the sensor sections in order to form a hole accumulation layer on light receiving surfaces of the sensor sections.

In the solid state imaging device according to the second embodiment of the present invention, since the layer having negative fixed electric charges that forms the hole accumulation layer on the light receiving surfaces of the sensor sections is formed on the light incidence side of the sensor sections, the layer having negative fixed electric charges is not formed in the peripheral circuit section. Accordingly, holes do not gather in the peripheral circuit section because the hole accumulation layer generated by the layer having negative fixed electric charges is not formed in the peripheral circuit section, and a change in an electric potential of a well region, a diffusion layer, a circuit, and the like that are formed in the peripheral circuit section to generate the negative electric potential does not occur because the holes do not move into the peripheral circuit section.

According to a third embodiment of the present invention, a method of manufacturing a solid state imaging device having a plurality of sensor sections formed in a semiconductor substrate in order to convert incident light into an electric signal, a peripheral circuit section formed in the semiconductor substrate so as to be positioned beside the sensor sections, and a layer having negative fixed electric charges that is formed on a light incidence side of the sensor sections in order to form a hole accumulation layer on light receiving surfaces of the sensor sections includes the step of: forming an N-type impurity region between the peripheral circuit section and the layer having negative fixed electric charges.

In the solid state imaging device according to the third embodiment of the present invention, since the N-type impurity region is formed between the peripheral circuit section and the layer having negative fixed electric charges, the movement of holes generated on the interface of the semiconductor substrate is prevented by the N-type impurity region. Accordingly, since it is prevented that the holes move into the peripheral circuit section, a change in an electric potential of a well region, a diffusion layer, a circuit, and the like that are formed in the peripheral circuit section so as to generate a negative electric potential is suppressed.

According to a fourth embodiment of the present invention, a method of manufacturing a solid state imaging device having a plurality of sensor sections formed in a semiconductor substrate in order to convert incident light into an electric signal, a peripheral circuit section formed in the semiconductor substrate so as to be positioned beside the sensor sections, and a layer having negative fixed electric charges that is formed on a light incidence side of the sensor sections in order to form a hole accumulation layer on light receiving surfaces of the sensor sections includes the steps of: forming the layer having negative fixed electric charges; and removing the layer having negative fixed electric charges on the peripheral circuit section.

In the method according to the fourth embodiment of the present invention, since the layer having negative fixed electric charges that forms the hole accumulation layer on the light receiving surfaces of the sensor sections is formed on the light incidence side of the sensor sections, the layer having negative fixed electric charges is not formed in the peripheral circuit section. Accordingly, holes do not gather in the peripheral circuit section because the hole accumulation layer generated by the layer having negative fixed electric charges is not formed in the peripheral circuit section, and a change in an electric potential of a well region, a diffusion layer, a circuit, and the like that are formed in the peripheral circuit section to generate the negative electric potential does not occur because the holes do not move into the peripheral circuit section.

According to a fifth embodiment of the present invention, an imaging apparatus includes: a condensing optical section that condenses incident light; a solid state imaging device that receives the light condensed in the condensing optical section and performs photoelectric conversion of the received light; and a signal processing section that processes a signal photoelectrically converted. The solid state imaging device includes: a plurality of sensor sections formed in a semiconductor substrate in order to convert incident light into an electric signal; a peripheral circuit section formed in the semiconductor substrate so as to be positioned beside the sensor sections; and a layer having negative fixed electric charges that is formed on the semiconductor substrate at a light incidence side of the sensor sections in order to form a hole accumulation layer on light receiving surfaces of the sensor sections. An N-type impurity region is formed between the peripheral circuit section and the layer having negative fixed electric charges.

In the imaging apparatus according to the fifth embodiment of the present invention, the solid state imaging device according to the embodiment of the present invention is used. Therefore, even if the layer having negative fixed electric charges that forms the hole accumulation layer on the light receiving surfaces of the sensor sections is formed, the solid state imaging device capable of suppressing a change in an electric potential of a well region, a diffusion layer, a circuit, and the like that are formed in the peripheral circuit section to generate the negative electric potential is used.

According to a sixth embodiment of the present invention, an imaging apparatus includes: a condensing optical section that condenses incident light; a solid state imaging device that receives the light condensed in the condensing optical section and performs photoelectric conversion of the received light; and a signal processing section that processes a signal photoelectrically converted. The solid state imaging device includes: a plurality of sensor sections formed in a semiconductor substrate in order to convert incident light into an electric signal; a peripheral circuit section formed in the semiconductor substrate so as to be positioned beside the sensor sections; and a layer having negative fixed electric charges that is formed on a light incidence side of the sensor sections in order to form a hole accumulation layer on light receiving surfaces of the sensor sections.

In the imaging apparatus according to the sixth embodiment of the present invention, the solid state imaging device according to the embodiment of the present invention is used. Therefore, even if the layer having negative fixed electric charges that forms the hole accumulation layer on the light receiving surfaces of the sensor sections is formed, the solid state imaging device in which a change in an electric potential of a well region, a diffusion layer, a circuit, and the like, which are formed in the peripheral circuit section to generate the negative electric potential, is used.

In the solid state imaging device according to the first embodiment of the present invention, the N-type impurity region is formed between a circuit of the peripheral circuit section and the layer having negative fixed electric charges. Accordingly, since it can be prevented that holes generated on the interface of the semiconductor substrate move into the peripheral circuit section, there is an advantage that a change in an electric potential of the circuit formed in the peripheral circuit section can be suppressed. As a result, a dark current of the sensor section can be reduced by the hole accumulation layer generated by the layer having negative fixed electric charges formed on the light receiving surface of the sensor section without fluctuating the electric potential of the peripheral circuit section.

In the solid state imaging device according to the second embodiment of the present invention, the layer having negative fixed electric charges is not formed in the peripheral circuit section. Accordingly, since it can be prevented that holes are generated on the interface of the semiconductor substrate of the peripheral circuit section, there is an advantage that a change in an electric potential of a circuit formed in the peripheral circuit section does not occur. As a result, a dark current of the sensor section can be reduced by the hole accumulation layer generated by the layer having negative fixed electric charges formed on the light receiving surface of the sensor section without fluctuating the electric potential of the peripheral circuit section.

In the method of manufacturing a solid state imaging device according to the third embodiment of the present invention, the N-type impurity region is formed between a circuit of the peripheral circuit section and the layer having negative fixed electric charges. Accordingly, since it can be prevented that holes generated on the interface of the semiconductor substrate move into the peripheral circuit section, there is an advantage that a change in an electric potential of the circuit formed in the peripheral circuit section can be suppressed. As a result, a dark current of the sensor section can be reduced by the hole accumulation layer generated by the layer having negative fixed electric charges formed on the light receiving surface of the sensor section without fluctuating the electric potential of the peripheral circuit section.

In the method of manufacturing a solid state imaging device according to the fourth embodiment of the present invention, the layer having negative fixed electric charges is not formed in the peripheral circuit section. Accordingly, since it can be prevented that holes are generated on the interface of the semiconductor substrate of the peripheral circuit section, there is an advantage that a change in an electric potential of a circuit formed in the peripheral circuit section does not occur. As a result, a dark current of the sensor section can be reduced by the hole accumulation layer generated by the layer having negative fixed electric charges formed on the light receiving surface of the sensor section without fluctuating the electric potential of the peripheral circuit section.

In the imaging apparatuses according to the fifth and sixth embodiments of the present invention, the solid state imaging device according to the embodiment of the present invention capable of reducing a dark current of the sensor section without fluctuating the electric potential of the peripheral circuit section is used as an imaging device. Accordingly, there is an advantage that a high-quality image can be recorded.

DESCRIPTION OF THE PREFERRED EMBODIMENTS

Figure 1:
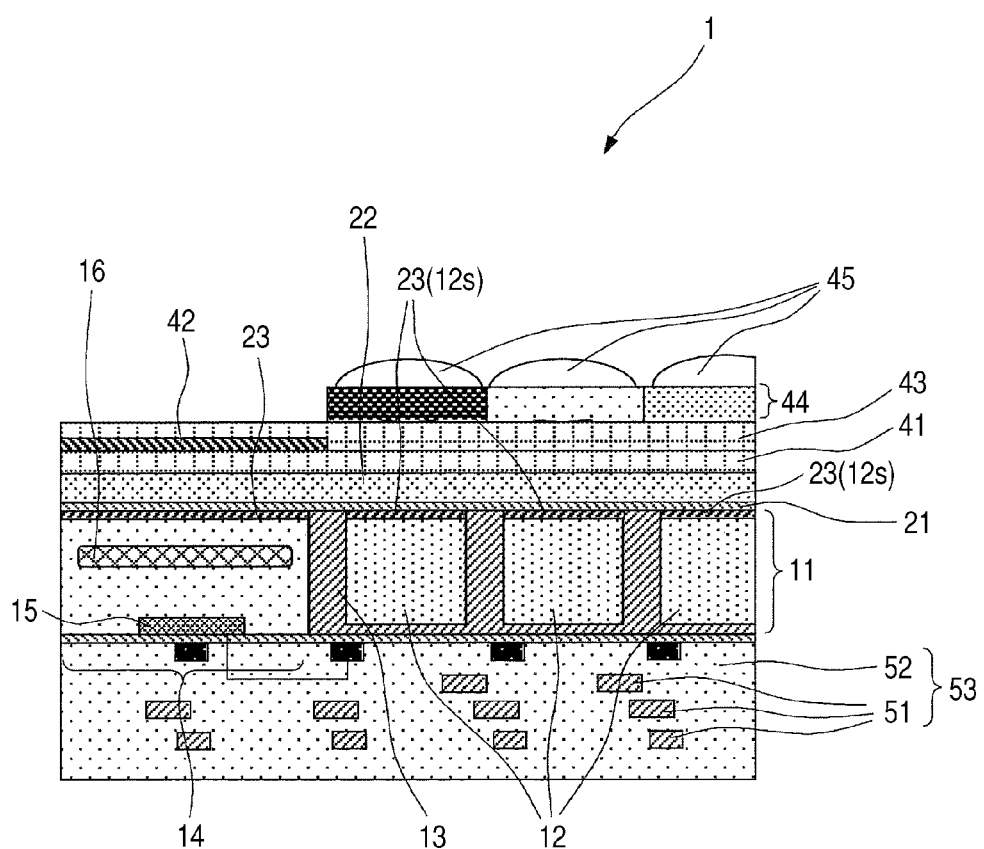
FIG. 1 is a cross-sectional view illustrating the schematic configuration of a solid state imaging device according to an embodiment (first example) of the present invention.

A solid state imaging device according to an embodiment (first example) of the present invention will be described with reference to a cross-sectional view of FIG. 1 illustrating the schematic configuration.

As shown in FIG. 1, a solid state imaging device 1 includes a sensor section 12, which performs photoelectric conversion of incident light, in a semiconductor substrate (or a semiconductor layer) 11. On a side section of the sensor section 12, a peripheral circuit section 14 in which a well region, a diffusion layer, a circuit, and the like (a diffusion layer 15 is shown as an example in the drawing) are formed with a pixel separating region 13 interposed therebetween is provided. The following explanation will be made using the semiconductor substrate 11. On a light receiving surface 12s of the sensor section (including a hole accumulation layer 23 which will be described later) 12, an interface state lowering layer 21 is formed. The interface state lowering layer 21 is formed of a silicon oxide ($SiO_2$) layer, for example. On the interface state lowering layer 21, a layer 22 having negative fixed electric charges is formed. Thus, the hole accumulation layer 23 is formed at a side of the light receiving surface 12s of the sensor section 12. Accordingly, at least on the sensor section 12, the interface state lowering layer 21 is formed in a film thickness that the hole accumulation layer 23 is formed at a side of the light receiving surface 12s of the sensor section 12 by the layer 22 having negative fixed electric charges. For example, the film thickness is set to be equal to or larger than one atomic layer and equal to or smaller than 100 nm.

In the case when the solid state imaging device 1 is a CMOS image sensor, for example, a pixel circuit configured to include transistors, such as a transfer transistor, a reset transistor, an amplifying transistor, and a selection transistor, is provided as the peripheral circuit section 14. In addition, a driving circuit which performs an operation of reading a signal on a read line of a pixel array section formed by the plurality of sensor sections 12, a vertical scanning circuit which transmits the read signal, a shift register or an address decoder, a horizontal scanning circuit, and the like are included.

Moreover, in the case when the solid state imaging device 1 is a CCD image sensor, for example, a read gate which reads a signal charge photoelectrically converted by the sensor section to a vertical transfer gate and a vertical charge transfer section which transmits the read signal charge in the vertical direction are provided as the peripheral circuit section 14. In addition, a horizontal charge transfer section and the like are included.

Furthermore, on a side of the semiconductor substrate 11 opposite a light incidence side thereof, a wiring layer 53 configured to include wiring lines 51, which are provided over a plurality of layers, and an insulating layer 52 for insulation between layers of the wiring lines 51 and between the wiring lines 51 of each layer is formed.

The layer 22 having negative fixed electric charges is formed of a hafnium oxide ($HfO_2$) layer, an aluminium oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. Examples of the layer forming method include a chemical vapor deposition method, a sputtering method, and an atomic layer deposition method. Here, it is preferable to use the atomic layer deposition method because an $SiO_2$ layer which lowers the interface state can be simultaneously formed in a thickness of 1 nm during the film formation. In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be mentioned. In addition, the layer 22 having negative fixed electric charges may also be formed of a hafnium nitride layer, an aluminum nitride layer, a hafnium oxynitride layer, or an aluminum oxynitride layer.

The layer 22 having negative fixed electric charges may have silicone (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

An N-type impurity region 16 is formed in the semiconductor substrate 11 between the peripheral circuit section 14 and the layer 22 having negative fixed electric charges. The N-type impurity region 16 is formed by N-type impurities, such as phosphorus (P) and arsenic (As), for example, and is formed by using ion implantation, for example. The N-type impurity region has an impurity profile equivalent to a channel stop, for example.

An insulating layer 41 is formed on the layer 22 having negative fixed electric charges, and a light shielding layer 42 is formed on the insulating layer 41 positioned above the peripheral circuit section 14. Although not shown, a region where light is not incident on the sensor section 12 is generated by the light shielding layer 42, and a black level in an image is determined by an output of the sensor section 12. In addition, since the light shielding layer 42 prevents light from being incident on the peripheral circuit section 14, a characteristic change caused by light incident on the peripheral circuit section is suppressed. Moreover, an insulating layer 43 which allows the incident light to be transmitted therethrough is formed. It is preferable that a surface of the insulating layer 43 be flat. Furthermore, an anti-reflection layer (not shown), a color filter layer 44 and a condensing lens 45 are formed on the insulating layer 43.

In the solid state imaging device 1 according to the first embodiment, since the N-type impurity region 16 is formed between the peripheral circuit section 14 and the layer 22 having negative fixed electric charges, the movement of holes generated on the interface of the semiconductor substrate 11 is prevented by the N-type impurity region 16. Accordingly, since it is prevented that the holes move into the peripheral circuit section 14, a change in an electric potential of a well region, the diffusion layer 15, a circuit, and the like that are formed in the peripheral circuit section 14 to generate the negative electric potential is suppressed. As a result, a dark current of the sensor section 12 can be reduced by the hole accumulation layer 23 generated by the layer 22 having negative fixed electric charges formed on the light receiving surface 12s of the sensor section 12 without fluctuating the electric potential of the peripheral circuit section 14.

Figure 2:
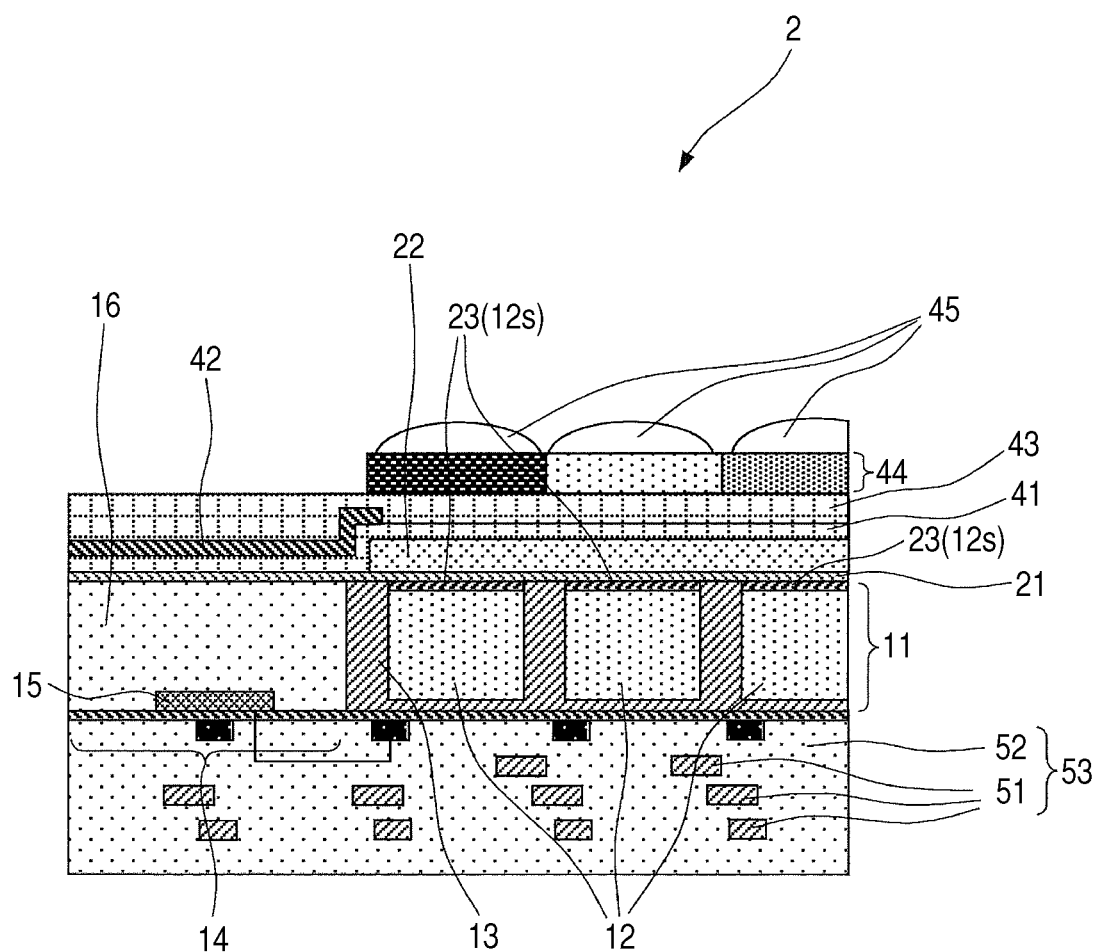
FIG. 2 is a cross-sectional view illustrating the schematic configuration of a solid state imaging device according to an embodiment (second example) of the present invention.

Next, a solid state imaging device according to an embodiment (second example) of the present invention will be described with reference to a cross-sectional view of FIG. 2 illustrating the schematic configuration.

As shown in FIG. 2, a solid state imaging device 2 includes a sensor section 12, which performs photoelectric conversion of incident light, in a semiconductor substrate (or a semiconductor layer) 11. On a side section of the sensor section 12, a peripheral circuit section 14 in which a well region, a diffusion layer, a circuit, and the like (a diffusion layer 15 is shown as an example in the drawing) are formed with a pixel separating region 13 interposed therebetween is provided. The following explanation will be made using the semiconductor substrate 11. On a light receiving surface 12s of the sensor section (including the hole accumulation layer 23 which will be described later) 12, the interface state lowering layer 21 is formed. The interface state lowering layer 21 is formed of a silicon oxide ($SiO_2$) layer, for example. On the interface state lowering layer 21, a layer 22 having negative fixed electric charges is formed. Thus, the hole accumulation layer 23 is formed at a side of the light receiving surface 12s of the sensor section 12. Accordingly, at least on the sensor section 12, the interface state lowering layer 21 is formed in a film thickness that the hole accumulation layer 23 is formed at a side of the light receiving surface 12s of the sensor section 12 by the layer 22 having negative fixed electric charges. For example, the film thickness is set to be equal to or larger than one atomic layer and equal to or smaller than 100 nm.

In the case when the solid state imaging device 1 is a CMOS image sensor, for example, a pixel circuit configured to include transistors, such as a transfer transistor, a reset transistor, an amplifying transistor, and a selection transistor, is provided as the peripheral circuit section 14. In addition, a driving circuit which performs an operation of reading a signal on a read line of a pixel array section formed by the plurality of sensor sections 12, a vertical scanning circuit which transmits the read signal, a shift register or an address decoder, a horizontal scanning circuit, and the like are included.

Moreover, in the case when the solid state imaging device 1 is a CCD image sensor, for example, a read gate which reads a signal charge photoelectrically converted by the sensor section to a vertical transfer gate and a vertical charge transfer section which transmits the read signal charge in the vertical direction are provided as the peripheral circuit section 14. In addition, a horizontal charge transfer section and the like are included.

Furthermore, on a side of the semiconductor substrate 11 opposite a light incidence side thereof, a wiring layer 53 configured to include wiring lines 51, which are provided over a plurality of layers, and an insulating layer 52 for insulation between layers of the wiring lines 51 and between the wiring lines 51 of each layer is formed.

The layer 22 having negative fixed electric charges is formed of a hafnium oxide ($HfO_2$) layer, an aluminium oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. Examples of the layer forming method include a chemical vapor deposition method, a sputtering method, and an atomic layer deposition method. Here, it is preferable to use the atomic layer deposition method because an $SiO_2$ layer which lowers the interface state can be simultaneously formed in a thickness of 1 nm during the film formation. In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be mentioned. In addition, the layer 22 having negative fixed electric charges may also be formed of a hafnium nitride layer, an aluminum nitride layer, a hafnium oxynitride layer, or an aluminum oxynitride layer.

The layer 22 having negative fixed electric charges may have silicone (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

The layer 22 having negative fixed electric charges is formed only on the sensor section 12 so that the hole accumulation layer 23 is formed on the light receiving surface 12s of the sensor section 12, but is not formed on the peripheral circuit section 14 (light incidence side).

An insulating layer 41 is formed on the layer 22 having negative fixed electric charges, and a light shielding layer 42 is formed on the insulating layer 41 positioned above the peripheral circuit section 14. Although not shown, a region where light is not incident on the sensor section 12 is generated by the light shielding layer 42, and a black level in an image is determined by an output of the sensor section 12. In addition, since the light shielding layer 42 prevents light from being incident on the peripheral circuit section 14, a characteristic change caused by light incident on the peripheral circuit section is suppressed. Moreover, an insulating layer 43 which allows the incident light to be transmitted therethrough is formed. It is preferable that a surface of the insulating layer 43 be flat. Furthermore, an anti-reflection layer (not shown), a color filter layer 44 and a condensing lens 45 are formed on the insulating layer 43.

In the solid state imaging device 2 in the second example, since the layer 22 having negative fixed electric charges which forms the hole accumulation layer 23 is formed on the light receiving surface 12s of the sensor section 12, the layer 22 having negative fixed electric charges is not formed in the peripheral circuit section 14. Accordingly, holes do not gather in the peripheral circuit section 14 because the hole accumulation layer 23 generated by the layer 22 having negative fixed electric charges is not formed in the peripheral circuit section 14, and a change in an electric potential of a well region, the diffusion layer 15, a circuit, and the like that are formed in the peripheral circuit section 14 to generate a negative electric potential does not occur because the holes do not move into the peripheral circuit section 14. As a result, a dark current of the sensor section 12 can be reduced by the hole accumulation layer 23 generated by the layer 22 having negative fixed electric charges formed on the light receiving surface 12s of the sensor section 12 without fluctuating the electric potential of the peripheral circuit section 14.

In addition, in the first and second examples, the neighborhood of the interface can be used as the hole accumulation layer 23 by the negative fixed electric charges present in the layer from immediately after forming the layer 22 having negative fixed electric charges. Accordingly, a dark current generated by the interface state on the interface between the sensor section 12 and the interface state lowering layer 21 is suppressed. That is, electric charges (electrons) generated from the interface is suppressed. In addition, even if electric charges (electrons) are generated from the interface, the electric charges (electrons) do not flow to a charge accumulation portion which is a potential well in the sensor section 12 but flow to the hole accumulation layer 23 in which many holes exist and accordingly, the electric charges (electrons) can be removed. Thus, since it can be prevented that a dark current generated by the electric charges on the interface is detected in the sensor section 12, a dark current caused by the interface state is suppressed. Furthermore, generation of electrons due to the interface state is further suppressed since the interface state lowering layer 21 is formed on the light receiving surface 12s of the sensor section 12. As a result, it is suppressed that electrons generated due to the interface state flow to the sensor section 12 as a dark current.

In each of the above examples, a back illuminated solid state imaging device that includes a plurality of pixel sections each having the sensor section 12, which serves to convert incident light into an electric signal, and the wiring layer 53 provided on a surface of the semiconductor substrate 11 formed with the pixel sections and that receives light, which is incident from a side opposite a surface on which the wiring layer 53 is formed, in the sensor section 12 has been explained. The configuration in the embodiment of the present invention may also be applied to a top-emission-type solid state imaging device in which incident light is incident on the sensor section from the side where the wiring layer and the like are formed.

Figure 3A:
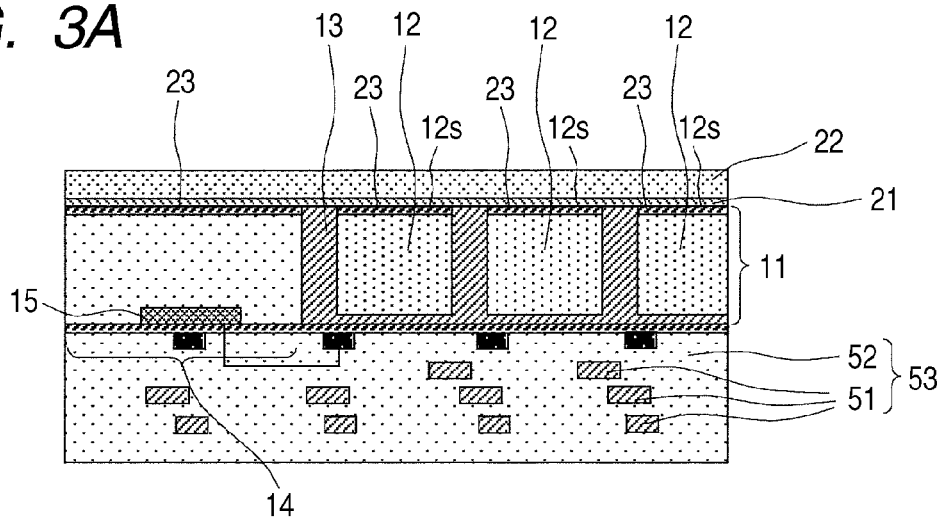
FIGS. 3A to 3C are cross-sectional views illustrating a manufacturing process in a method of manufacturing a solid state imaging device according to an embodiment (first example) of the present invention.
Figure 3B:
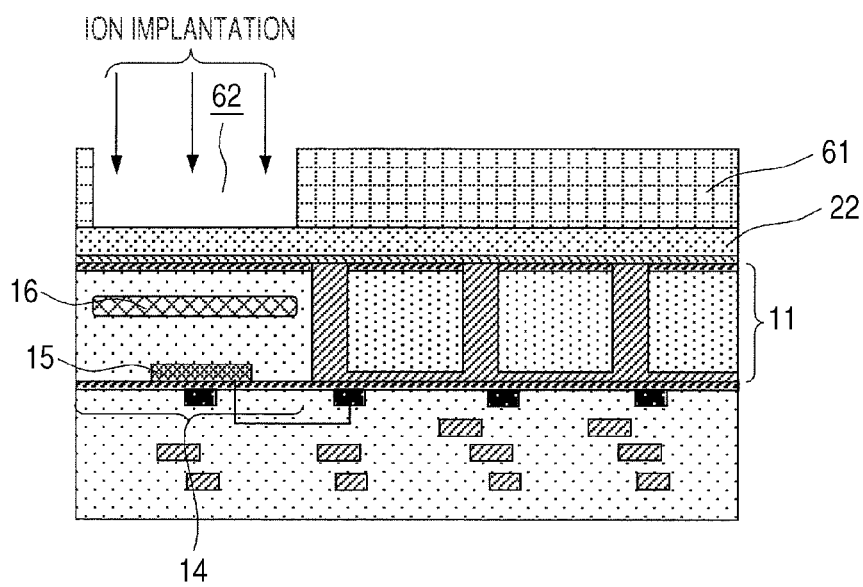
Figure 3C:
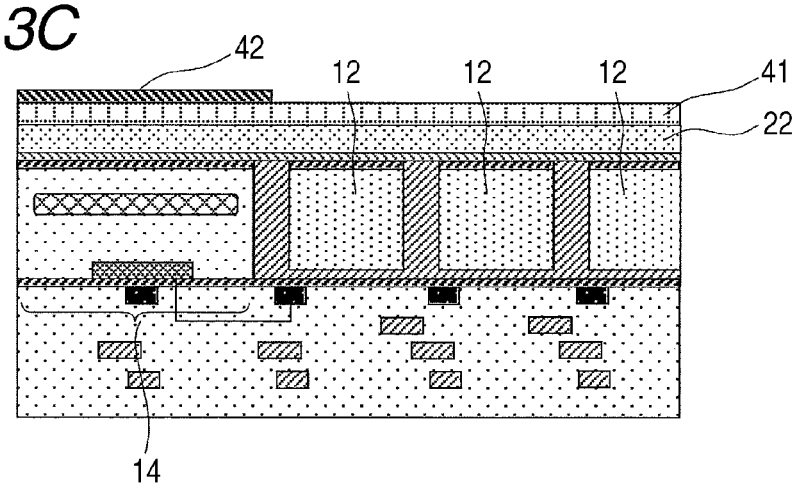
Figure 4:
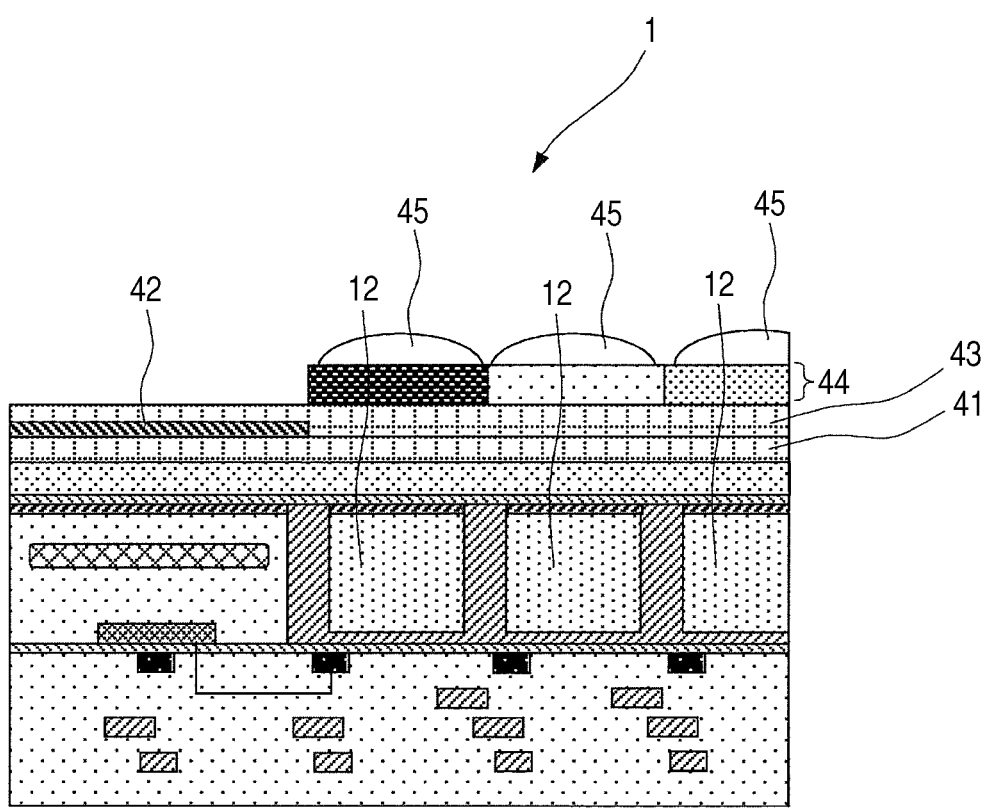
FIG. 4 is a cross-sectional view illustrating a manufacturing process in the method of manufacturing a solid state imaging device according to the embodiment (first example) of the present invention.

Next, a method of manufacturing a solid state imaging device according to an embodiment (first example) of the present invention will be described with reference to cross-sectional views of a manufacturing process of FIGS. 3A to 4 illustrating main parts. In FIGS. 3A to 4, a manufacturing process of the solid state imaging device 1 is shown as an example.

As shown in FIG. 3A, the sensor section 12 which performs photoelectric conversion of incident light, the pixel separating region 13 for separating the sensor section 12, and the peripheral circuit section 14 in which a well region, a diffusion layer, a circuit, and the like (the diffusion layer 15 is shown as an example in the drawing) are formed with the pixel separating region 13 interposed between the peripheral circuit section 14 and the sensor section 12 are formed in the semiconductor substrate (or semiconductor layer) 11. Then, on a side of the semiconductor substrate 11 opposite the light incidence side, the wiring layer 53 configured to include the wiring lines 51 provided over a plurality of layers and the insulating layer 52 for insulation between layers of the wiring lines 51 and between the wiring lines 51 of each layer is formed. A known manufacturing method is used as the manufacturing method configured as described above.

Then, the interface state lowering layer 21 is formed on the light receiving surface 12s of the sensor section 12, actually, on the semiconductor substrate 11. The interface state lowering layer 21 is formed of a silicon oxide ($SiO_2$) layer, for example. Subsequently, the layer 22 having negative fixed electric charges is formed on the interface state lowering layer 21. Thus, the hole accumulation layer 23 is formed at the light receiving surface side of the sensor section 12. Accordingly, at least on the sensor section 12, the interface state lowering layer 21 needs to be formed in a film thickness that the hole accumulation layer 23 is formed at a side of the light receiving surface 12s of the sensor section 12 by the layer 22 having negative fixed electric charges. For example, the film thickness is set to be equal to or larger than one atomic layer and equal to or smaller than 100 nm.

The layer 22 having negative fixed electric charges is formed of a hafnium oxide ($HfO_2$) layer, an aluminium oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. For example, a chemical vapor deposition method, a sputtering method, and an atomic layer deposition method may be used as the layer forming method. Here, it is preferable to use the atomic layer deposition method because an $SiO_2$ layer which lowers the interface state can be simultaneously formed in a thickness of 1 nm during the film formation.

In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be used. In addition, the layer 22 having negative fixed electric charges may also be formed of a hafnium nitride layer, an aluminum nitride layer, a hafnium oxynitride layer, or an aluminum oxynitride layer. These layers may also be formed by using the chemical vapor deposition method, the sputtering method, or the atomic layer deposition method, for example.

In addition, the layer 22 having negative fixed electric charges may have silicon (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

Then, as shown in FIG. 3B, the N-type impurity region 16 is formed by injecting N-type impurities into the semiconductor substrate 11 between the peripheral circuit section 14 and the layer 22 having negative fixed electric charges. As a specific example of a method of manufacturing the N-type impurity region 16, a resist layer 61 is formed on the layer 22 having negative fixed electric charges and then an opening 62 is formed in the resist layer 61 on the peripheral circuit section 14 by using a lithography technique. Thereafter, the N-type impurity region 16 is formed in the semiconductor substrate 11 between the peripheral circuit section 14 and the layer 22 having negative fixed electric charges by performing ion implantation of N-type impurities into the semiconductor substrate 11 on the peripheral circuit section 14 by using the resist layer 61 as a mask for ion implantation.

Since the N-type impurity region 16 has the same impurity profile as a channel stop, for example, the N-type impurity region 16 prevents holes generated on the interface of the semiconductor substrate 11 from moving into the semiconductor substrate 11, suppressing a change in an electric potential of a well region (not shown) or an electric potential of the diffusion layer 15 which is formed in the semiconductor substrate 11. Then, the resist layer 61 is removed.

Then, as shown in FIG. 3C, the insulating layer 41 is formed on the layer 22 having negative fixed electric charges, and then the light shielding layer 42 is formed on the insulating layer 41. The insulating layer 41 is formed of a silicon oxide layer, for example. In addition, the light shielding layer 42 is formed of a metallic layer having a light shielding property, for example. Thus, reaction of metal of the light shielding layer 42 and the layer 22 having negative fixed electric charges formed of an hafnium oxide layer, for example, can be prevented by forming the light shielding layer 42 on the layer 22 having negative fixed electric charges with the insulating layer 41 interposed therebetween. In addition, since the insulating layer 42 serves as an etching stopper when the light shielding layer is etched, etching damage to the layer 22 having negative fixed electric charges can be prevented.

Although not shown, a region where light is not incident on the sensor section 12 is generated by the light shielding layer 42, and a black level in an image is determined by an output of the sensor section 12. In addition, since the light shielding layer 42 prevents light from being incident on the peripheral circuit section 14, a characteristic change caused by light incident on the peripheral circuit section is suppressed.

Then, as shown in FIG. 4, the insulating layer 43 for reducing a level difference caused by the light shielding layer 42 is formed on the insulating layer 41. A surface of the insulating layer 43 is preferably flat and is formed of a coating insulating layer, for example.

Then, an anti-reflection layer (not shown) and the color filter layer 44 are formed on the insulating layer 43 positioned above the sensor section 12 and then the condensing lens 45 is formed on the color filter layer 44 by a known manufacturing technique. In this case, a light-transmissive insulating layer (not shown) may be formed between the color filter layer 44 and the condensing lens 45 in order to prevent machining damage to the color filter layer 44 at the time of lens processing. Thus, the solid state imaging device 1 is formed.

In the first example of the method (first manufacturing method) of manufacturing a solid state imaging device, since the N-type impurity region 16 is formed between the peripheral circuit section 14 and the layer 22 having negative fixed electric charges, the movement of holes generated on the interface of the semiconductor substrate 11 is prevented by the N-type impurity region 16. Accordingly, since it is prevented that the holes move into the peripheral circuit section 14, a change in an electric potential of a well region, the diffusion layer 15, a circuit, and the like that are formed in the peripheral circuit section 14 is suppressed. As a result, a desired negative electric potential can be obtained in the peripheral circuit section 14.

As a result, a dark current of the sensor section 12 can be reduced by the hole accumulation layer 23 generated by the layer 22 having negative fixed electric charges formed on the light receiving surface 12s of the sensor section 12 without fluctuating the electric potential of the peripheral circuit section 14. That is, since the hole accumulation layer 23 is formed, electric charges (electrons) generated from the interface is suppressed. Even if electric charges (electrons) are generated from the interface, the electric charges (electrons) do not flow to a charge accumulation portion which is a potential well in the sensor section 12 but flow to the hole accumulation layer 23 in which many holes exist. As a result, the electric charges (electrons) can be removed. Thus, since it can be prevented that a dark current generated by the electric charges on the interface is detected in the sensor section, a dark current caused by the interface state is suppressed. Furthermore, generation of electrons due to the interface state is further suppressed since the interface state lowering layer 21 is formed on the light receiving surface of the sensor section 12. As a result, it is suppressed that electrons generated due to the interface state flow to the sensor section 12 as a dark current.

The N-type impurity region 16 may be formed before the layer 22 having negative fixed electric charges is formed or may be formed after the layer 22 having negative fixed electric charges is formed as described above.

Figure 5A:
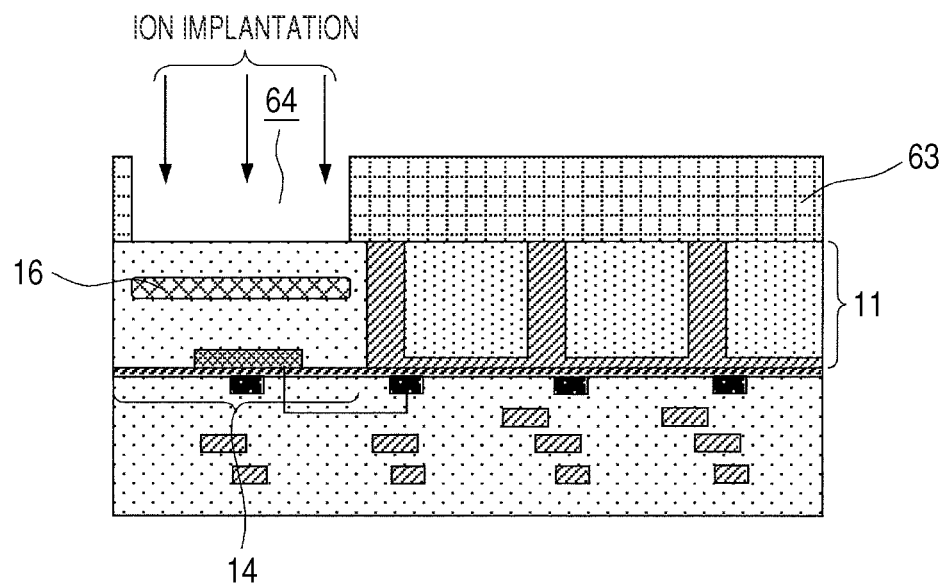
FIGS. 5A and 5B are cross-sectional views illustrating a manufacturing process in a modification of the manufacturing method according to the first example.

For example, as shown in FIG. 5A, before the interface state lowering layer 21 (not shown) is formed, a mask for ion implantation is formed on the semiconductor substrate 11 by using a resist layer 63 having an opening 64 provided on the peripheral circuit section 14 in the same manner as described above, and then the N-type impurity region 16 is formed in the semiconductor substrate 11 on the peripheral circuit section 14 by using an ion implantation method. Then, although not shown, the interface state lowering layer 21 and the layer 22 having negative fixed electric charges are sequentially formed after removing the resist layer 63.

In this case, ion implantation damage may occur in the semiconductor substrate 11 because ions are implanted into the semiconductor substrate 11. However, since a portion of the semiconductor substrate 11 where the N-type impurity region 16 is formed is a region where a well region, a diffusion layer, and the like are not formed, there is no actual damage even if the ion implantation damage occurs.

Figure 5B:
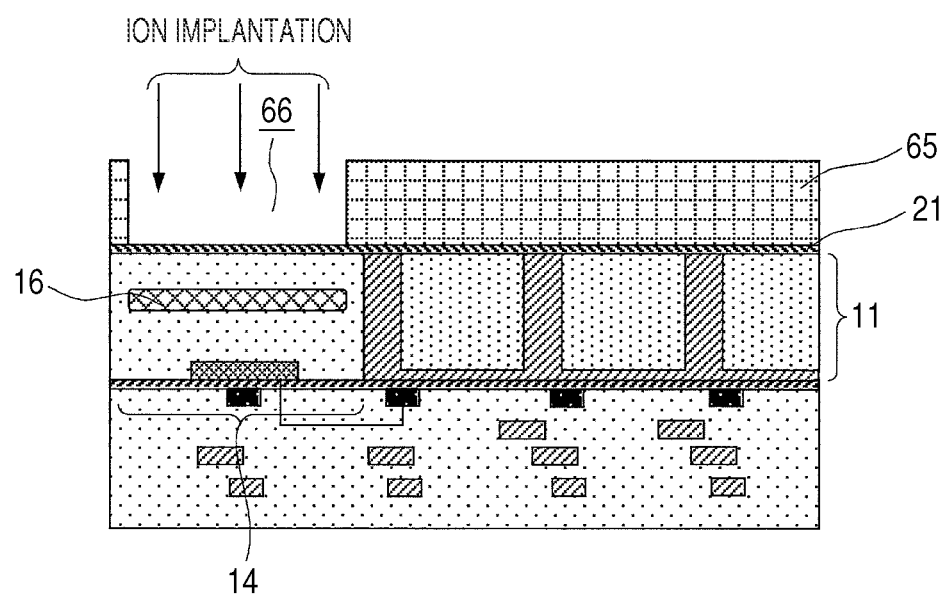

Alternatively, for example, as shown in FIG. 5B, after the interface state lowering layer 21 is formed, a mask for ion implantation is formed by using a resist layer 65 having an opening 66 provided on the peripheral circuit section 14 in the same manner as described above, and then the N-type impurity region 16 is formed in the semiconductor substrate 11 on the peripheral circuit section 14 by using the ion implantation method. Then, although not shown, the layer 22 having negative fixed electric charges is formed on the interface state lowering layer 21 after removing the resist layer 65.

In this case, since the interface state lowering layer 21 serves as a buffer layer at the time of ion implantation, the ion implantation damage to the semiconductor substrate 11 is reduced.

Thus, the N-type impurity region 16 may also be formed before forming the layer 22 having negative fixed electric charges.

Next, a method of manufacturing a solid state imaging device according to an embodiment (second example) of the present invention will be described with reference to cross-sectional views of a manufacturing process of FIGS. 6A to 7B illustrating main parts. In FIGS. 6A to 7B, a manufacturing process of the solid state imaging device 2 is shown as an example.

Figure 6A:
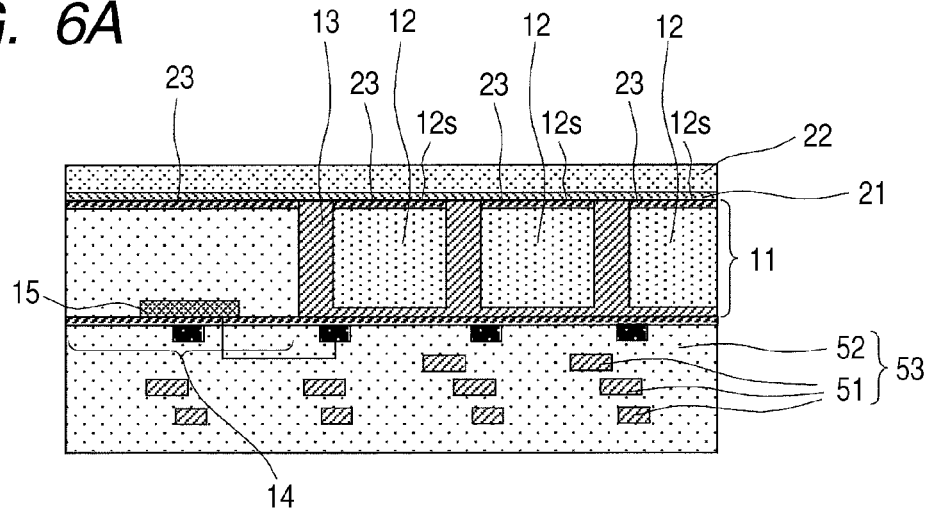
FIGS. 6A to 6C are cross-sectional views illustrating a manufacturing process in the method of manufacturing a solid state imaging device according to the embodiment (second example) of the present invention.

As shown in FIG. 6A, the sensor section 12 which performs photoelectric conversion of incident light, the pixel separating region 13 for separating the sensor section 12, and the peripheral circuit section 14 in which a well region, a diffusion layer, a circuit, and the like (the diffusion layer 15 is shown as an example in the drawing) are formed with the pixel separating region 13 interposed between the peripheral circuit section 14 and the sensor section 12 are formed in the semiconductor substrate (or semiconductor layer) 11. Then, on a side of the semiconductor substrate 11 opposite the light incidence side, the wiring layer 53 configured to include the wiring lines 51 provided over a plurality of layers and the insulating layer 52 for insulation between layers of the wiring lines 51 and between the wiring lines 51 of each layer is formed. A known manufacturing method is used as the manufacturing method configured as described above.

Then, the interface state lowering layer 21 is formed on the light receiving surface 12s of the sensor section 12, actually, on the semiconductor substrate 11. The interface state lowering layer 21 is formed of a silicon oxide ($SiO_2$) layer, for example. Subsequently, the layer 22 having negative fixed electric charges is formed on the interface state lowering layer 21. Thus, the hole accumulation layer 23 is formed at a side of the light receiving surface 12s of the sensor section 12. Accordingly, at least on the sensor section 12, the interface state lowering layer 21 needs to be formed in a film thickness that the hole accumulation layer 23 is formed at a side of the light receiving surface 12s of the sensor section 12 by the layer 22 having negative fixed electric charges. For example, the film thickness is set to be equal to or larger than one atomic layer and equal to or smaller than 100 nm.

The layer 22 having negative fixed electric charges is formed of a hafnium oxide ($HfO_2$) layer, an aluminium oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. For example, a chemical vapor deposition method, a sputtering method, and an atomic layer deposition method may be used as the layer forming method. Here, it is preferable to use the atomic layer deposition method because an $SiO_2$ layer which lowers the interface state can be simultaneously formed in a thickness of 1 nm during the film formation.

In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be used. In addition, the layer 22 having negative fixed electric charges may also be formed of a hafnium nitride layer, an aluminum nitride layer, a hafnium oxynitride layer, or an aluminum oxynitride layer. These layers may also be formed by using the chemical vapor deposition method, the sputtering method, or the atomic layer deposition method, for example.

In addition, the layer 22 having negative fixed electric charges may have silicon (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

Figure 6B:
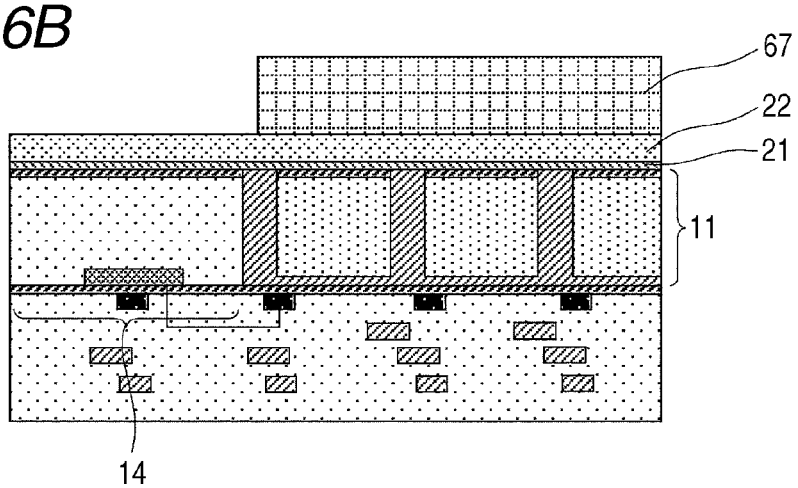

Then, as shown in FIG. 6B, a resist layer 67 is formed on the layer 22 having negative fixed electric charges, and then the resist layer 67 on the peripheral circuit section 14 is removed by using a lithography technique.

Figure 6C:
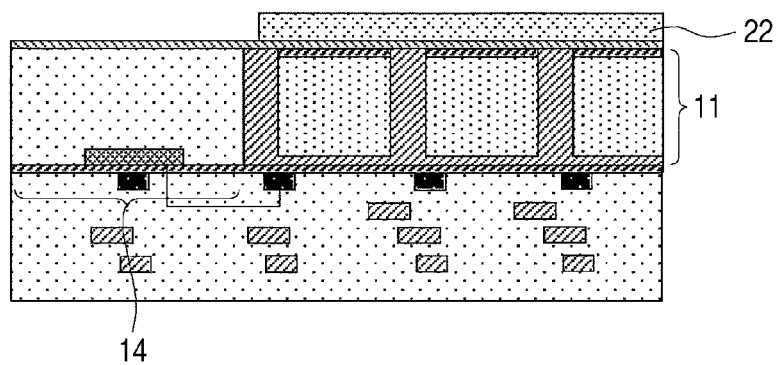

Then, as shown in FIG. 6C, the layer 22 having negative fixed electric charges on the peripheral circuit section 14 is removed by using the resist layer 67 (refer to FIG. 6B), as an etching mask.

In case of using dry etching in removing the layer 22 having negative fixed electric charges, a resist layer for dry etching is used as the resist layer 67. In addition, for dry etching, for example, argon and sulfur hexafluoride ($SF_6$) are used as etching gas. In the case of the layer 22 having negative fixed electric charges, etching using the above etching gas is possible. In addition, etching gas for etching other metal oxides may also be used to perform the dry etching. Then, the resist layer 67 is removed.

In the above dry etching, the semiconductor substrate 11 is not directly struck by ions since the interface state lowering layer 21 of a silicon oxide layer is formed on a base of the layer 22 having negative fixed electric charges. Accordingly, etching damage to the semiconductor substrate 11 is reduced.

In case of using wet etching in removing the layer 22 having negative fixed electric charges, a resist layer for wet etching is used as the resist layer 67. In addition, for wet etching, for example, fluoric acid and ammonium fluoride are used as etching solution. In the case of the layer 22 having negative fixed electric charges, etching using the above etching solution is possible. In addition, etching solution for etching other metal oxides may also be used to perform the well etching. Then, the resist layer 67 is removed.

In the above wet etching, permeation of the etching solution from a peripheral section to a pixel region is suppressed since the interface state lowering layer 21 of a silicon oxide layer is formed on a base of the layer 22 having negative fixed electric charges.

Figure 7A:
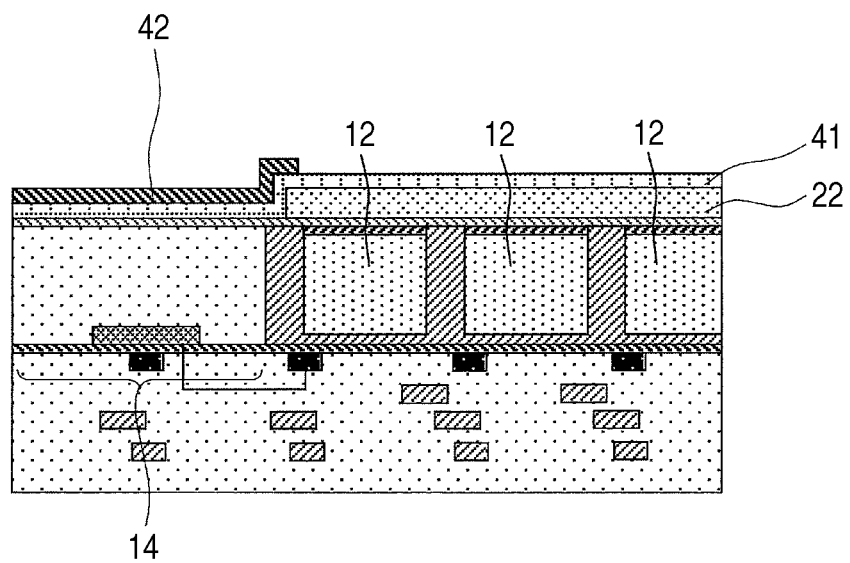
FIGS. 7A and 7B are cross-sectional views illustrating a manufacturing process in the method of manufacturing a solid state imaging device according to the embodiment (second example) of the present invention.

Then, as shown in FIG. 7A, the insulating layer 41 is formed on the layer 22 having negative fixed electric charges, and then the light shielding layer 42 is formed on the insulating layer 41. The insulating layer 41 is formed of a silicon oxide layer, for example. In addition, the light shielding layer 42 is formed of a metallic layer having a light shielding property, for example. Thus, reaction of metal of the light shielding layer 42 and the layer 22 having negative fixed electric charges formed of an hafnium oxide layer, for example, can be prevented by forming the light shielding layer 42 on the layer 22 having negative fixed electric charges with the insulating layer 41 interposed therebetween. In addition, since the insulating layer 42 serves as an etching stopper when the light shielding layer is etched, etching damage to the layer 22 having negative fixed electric charges can be prevented.

Although not shown, a region where light is not incident on the sensor section 12 is generated by the light shielding layer 42, and a black level in an image is determined by an output of the sensor section 12. In addition, since the light shielding layer 42 prevents light from being incident on the peripheral circuit section 14, a characteristic change caused by light incident on the peripheral circuit section is suppressed.

Figure 7B:
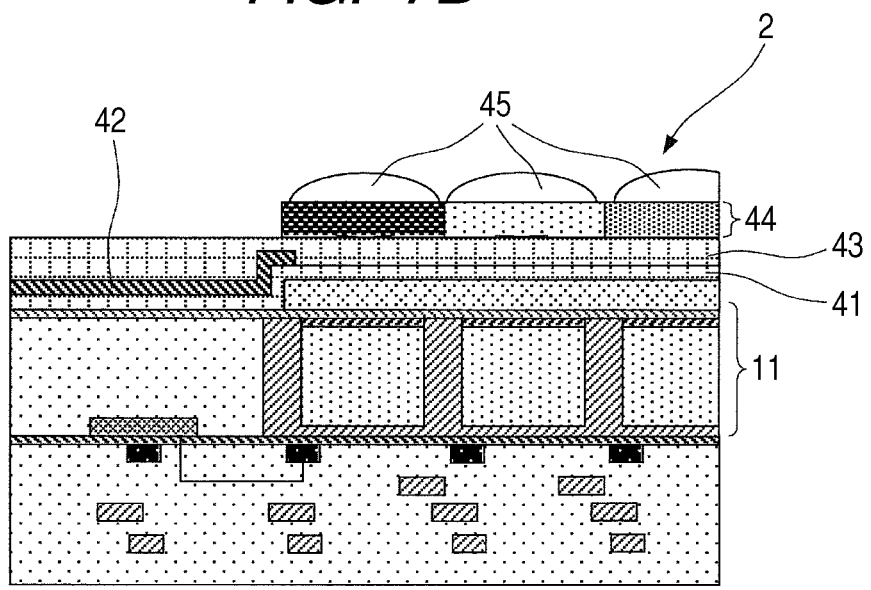

Then, as shown in FIG. 7B, the insulating layer 43 for reducing a level difference caused by the light shielding layer 42 is formed on the insulating layer 41. A surface of the insulating layer 43 is preferably flat and is formed of a coating insulating layer, for example.

Then, an anti-reflection layer (not shown) and the color filter layer 44 are formed on the insulating layer 43 positioned above the sensor section 12 and then the condensing lens 45 is formed on the color filter layer 44 by a known manufacturing technique. In this case, a light-transmissive insulating layer (not shown) may be formed between the color filter layer 44 and the condensing lens 45 in order to prevent machining damage to the color filter layer 44 at the time of lens processing. Thus, the solid state imaging device 2 is formed.

In the second example of the method of manufacturing a solid state imaging device, the layer 22 having negative fixed electric charges is not formed on the peripheral circuit section 14 since the layer 22 having negative fixed electric charges on the peripheral circuit section 14 is removed. Accordingly, holes do not gather in the peripheral circuit section 14 because the hole accumulation layer 23 generated by the layer 22 having negative fixed electric charges is not formed in the peripheral circuit section 14, and a change in an electric potential of a well region, the diffusion layer 15, a circuit, and the like that are formed in the peripheral circuit section 14 to generate a negative electric potential does not occur because the holes do not move into the peripheral circuit section 14.

As a result, a dark current of the sensor section 12 can be reduced by the hole accumulation layer 23 generated by the layer 22 having negative fixed electric charges formed on the light receiving surface 12s of the sensor section 12 without fluctuating the electric potential of the peripheral circuit section 14. That is, since the hole accumulation layer 23 is formed, electric charges (electrons) generated from the interface is suppressed. Even if electric charges (electrons) are generated from the interface, the electric charges (electrons) do not flow to a charge accumulation portion which is a potential well in the sensor section 12 but flow to the hole accumulation layer 23 in which many holes exist. As a result, the electric charges (electrons) can be removed. Thus, since it can be prevented that a dark current generated by the electric charges on the interface is detected in the sensor section, a dark current caused by the interface state is suppressed. Furthermore, generation of electrons due to the interface state is further suppressed since the interface state lowering layer 21 is formed on the light receiving surface of the sensor section 12. As a result, it is suppressed that electrons generated due to the interface state flow to the sensor section 12 as a dark current.

Each of the solid state imaging devices 1 and 2 in the above examples includes a plurality of pixel sections each having a light receiving section, which converts incident light into an electric signal, and a wiring layer provided on a surface of the semiconductor substrate formed with the pixel sections, and may be applied to aback illuminated solid state imaging device having a configuration in which light incident from a side opposite a surface on which the wiring layer is formed is received in each of the light receiving sections. It is needless to say that each of the solid state imaging devices 1 and 2 may also be applied as a top-emission-type solid state imaging device in which a wiring layer is formed on a light receiving surface side and incident light incident on the light receiving section is not blocked by setting an optical path of the incident light incident on the light receiving section as a region where the wiring layer is not formed.

Next, an imaging apparatus according to an embodiment (example) of the present invention will be described with reference to a block diagram of FIG. 8. Examples of the imaging apparatus include a video camera, a digital still camera, and a camera of a mobile phone.

Figure 8:
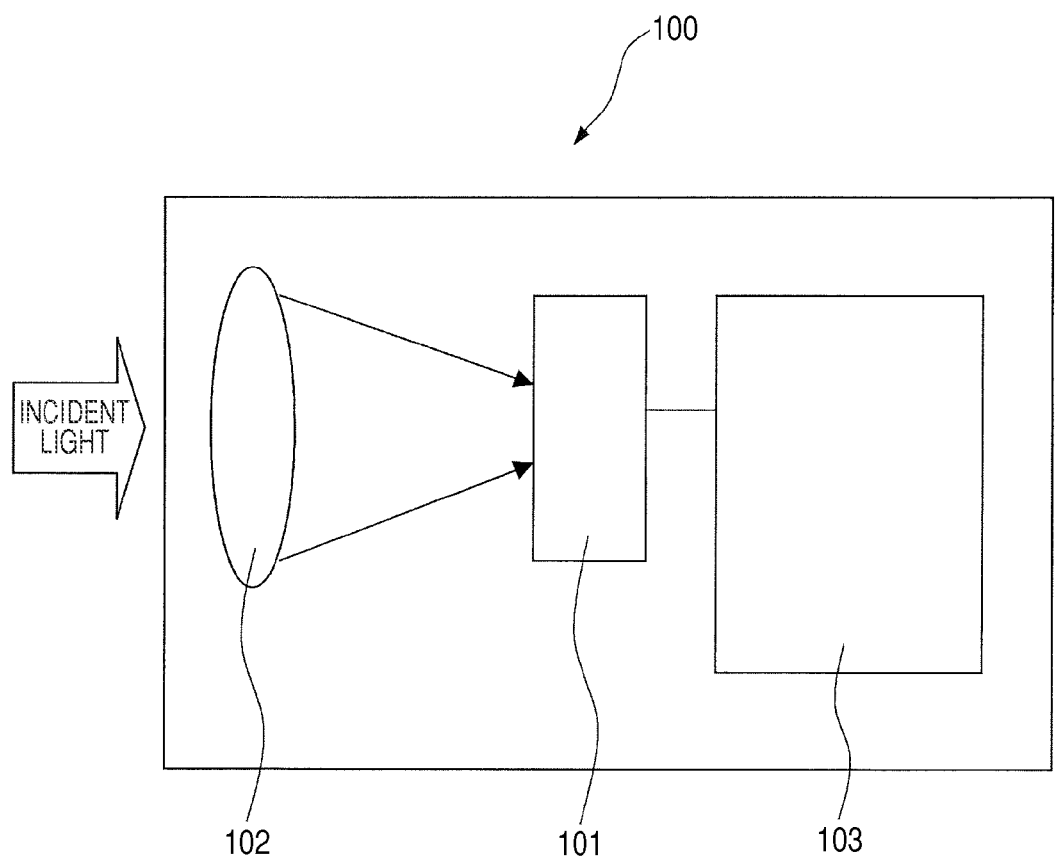
FIG. 8 is a block diagram illustrating an imaging apparatus according to an embodiment of the present invention.
Figure 9A:
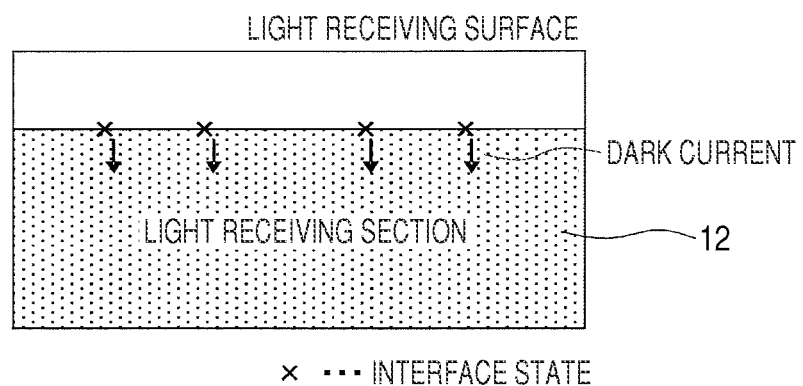
FIGS. 9A and 9B are cross-sectional views illustrating the schematic configuration of a light receiving section, which shows a technique of suppressing generation of a dark current due to the interface state.
Figure 9B:
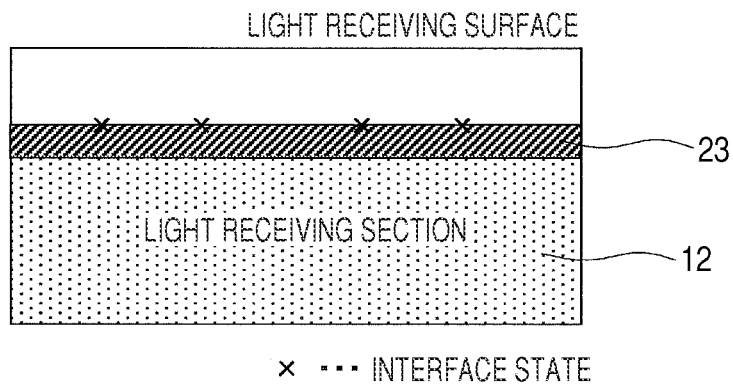
Figure 10:
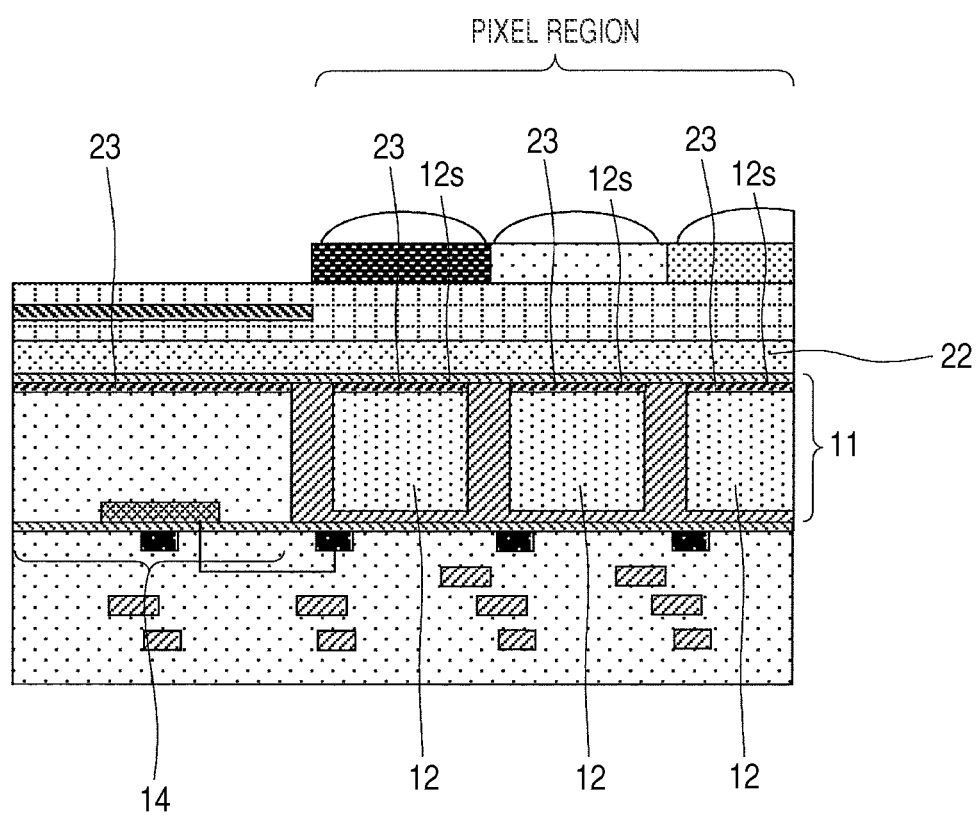
FIG. 10 is a cross-sectional view illustrating the schematic configuration of a known solid state imaging device, in which a layer having negative fixed electric charges is formed, in order to explain problems of the known solid state imaging device.

As shown in FIG. 8, an imaging apparatus 100 includes a solid state imaging device (not shown) provided in an imaging section 101. An imaging optical system 102 which images an image is provided at the condensing side of the imaging section 101. To the imaging section 101, a signal processing section 103 having a driving circuit for driving the imaging section 101, a signal processing circuit which processes an image photoelectrically converted in the solid state imaging device into an image, and the like are connected. In addition, the image signal processed by the signal processing section may be stored in an image storage section (not shown). In the imaging apparatus 100, the solid state imaging devices 1 to 2 described in the above embodiments may be used as the solid state imaging device.

In the imaging apparatus 100 according to the embodiment of the present invention, the solid state imaging device 1 or 2 according to the embodiment of the present invention capable of reducing a dark current of the sensor section without changing the electric potential of the peripheral circuit section, which is advantageous in that a high-quality image can be recorded.

Furthermore, the imaging apparatus 100 according to the embodiment of the present invention is not limited to having the above-described configuration but may be applied to an imaging apparatus having any kind of configuration as long as it is an imaging apparatus using a solid state imaging device.

In addition, the solid state imaging device 1 or 2 may be formed as a one chip type device or a module type device in which an imaging section and a signal processing section or an optical system are collectively packaged and which has an imaging function. In addition, the present invention may be applied to not only a solid-state imaging device but also an imaging apparatus. In this case, an effect of improving image quality can be obtained in the imaging apparatus. Here, the imaging apparatus refers to a camera or a portable apparatus having an imaging function, for example. In addition, the 'imaging' includes not only imaging of an image at the time of normal photographing of a camera but also detection of a fingerprint and the like in a broad sense of meaning.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid state imaging device having a sensor section formed in a semiconductor substrate in order to convert incident light into an electric signal, the method comprising the step of:
   forming a layer having negative fixed electric charges that is formed on a light incident side of the sensor section in order to form a hole accumulation layer on a light receiving surface of the sensor section.

2. The method of claim 1, wherein the layer is a hafnium oxide (HfO2) layer, an aluminium oxide (Al2O3) layer, a zirconium oxide (ZrO2) layer, a tantalum oxide (Ta2O5) layer, or a titanium oxide (TiO2) layer.

3. The method of claim 1, further comprising:
   forming a pixel section having the sensor section that converts incident light into an electric signal; and
   forming a wiring layer provided on a surface of the semiconductor substrate formed with the pixel section,
   wherein,
   the solid state imaging device is a back illuminated solid state imaging device that receives light, which is incident from a side opposite the surface on which the wiring layer is formed, in the sensor section.

4. The method of claim 1, wherein:
   the layer having negative fixed electric charges is formed on the light receiving surface of the sensor section on the semiconductor substrate positioned at the light incidence side of the sensor section, and
   an N-type impurity region is formed between a peripheral circuit section and the layer having negative fixed electric charges.

5. The method of claim 4, further comprising:
   forming a plurality of pixel sections each having a sensor section that converts incident light into an electric signal; and
   forming a wiring layer provided on a surface of the semiconductor substrate formed with the pixel sections,
   wherein,
   the solid state imaging device is a back illuminated solid state imaging device that receives light, which is incident from a side opposite the surface on which the wiring layer is formed, in the sensor sections.

6. A method of manufacturing a solid state imaging device having a sensor section formed in a semiconductor substrate in order to convert incident light into an electric signal, a peripheral circuit section formed in the semiconductor substrate so as to be positioned beside the sensor section, and a layer having negative fixed electric charges that is formed on a light incident side of the sensor section in order to form a hole accumulation layer on a light receiving surface of the sensor section, the method comprising the steps of:
- forming the layer having negative fixed electric charges; and
- removing the layer having negative fixed electric charges on the peripheral circuit section.

7. The method of claim 6, wherein the layer is a hafnium oxide (HfO2) layer, an aluminium oxide (Al2O3) layer, a zirconium oxide (ZrO2) layer, a tantalum oxide (Ta2O5) layer, or a titanium oxide (TiO2) layer.

8. The method of claim 6, further comprising:
- a pixel section having the sensor section that converts incident light into an electric signal; and
- a wiring layer provided on a surface of the semiconductor substrate formed with the pixel section,
- wherein,
  - the solid state imaging device is a back illuminated solid state imaging device that receives light, which is incident from a side opposite the surface on which the wiring layer is formed, in the sensor section.

9. A solid state imaging device comprising:
- a semiconductor substrate;
- a sensor section in the semiconductor substrate and capable of converting incident light into an electric signal; and
- a layer having negative fixed electric charges that is formed on a light incident side of the sensor section in order to form a hole accumulation layer on a light receiving surface of the sensor section.

10. The solid state imaging device according to claim 9, wherein the layer is a hafnium oxide (HfO2) layer, an aluminium oxide (Al2O3) layer, a zirconium oxide (ZrO2) layer, a tantalum oxide (Ta2O5) layer, or a titanium oxide (TiO2) layer.

11. The solid state imaging device according to claim 9, further comprising:
- a pixel section having the sensor section that converts incident light into an electric signal; and
- a wiring layer provided on a surface of the semiconductor substrate formed with the pixel section,
- wherein,
  - the solid state imaging device is a back illuminated solid state imaging device that receives light, which is incident from a side opposite the surface on which the wiring layer is formed, in the sensor section.

12. The solid state imaging device according to claim 9, wherein:
- the layer having negative fixed electric charges is formed on the light receiving surface of the sensor section on the semiconductor substrate positioned at the light incident side of the sensor section, and
- an N-type impurity region is formed between a peripheral circuit section and the layer having negative fixed electric charges.

13. The solid state imaging device according to claim 12, further comprising:
- a plurality of pixel sections each having a sensor section that converts incident light into an electric signal; and
- a wiring layer provided on a surface of the semiconductor substrate formed with the pixel sections,
- wherein,
  - the solid state imaging device is a back illuminated solid state imaging device that receives light, which is incident from a side opposite the surface on which the wiring layer is formed, in the sensor sections.

* * * * *